United States Patent
Law et al.

(10) Patent No.: US 12,362,008 B2
(45) Date of Patent: Jul. 15, 2025

(54) COMPUTE-IN-MEMORY ARCHITECTURE USING LOOK-UP TABLES

(71) Applicant: Kneron Inc., San Diego, CA (US)

(72) Inventors: Oscar Ming Kin Law, San Diego, CA (US); Chun Chen Liu, Taipei (TW)

(73) Assignee: Kneron Inc., San Diego, CA (US)

( * ) Notice: Subject to any disclaimer, the term of this patent is extended or adjusted under 35 U.S.C. 154(b) by 179 days.

(21) Appl. No.: 18/372,144

(22) Filed: Sep. 25, 2023

(65) Prior Publication Data

US 2025/0104762 A1    Mar. 27, 2025

(51) Int. Cl.
| | |
|---|---|
| G11C 11/4096 | (2006.01) |
| G06F 7/498 | (2006.01) |
| G06F 7/72 | (2006.01) |
| G11C 11/408 | (2006.01) |

(52) U.S. Cl.
CPC ........ *G11C 11/4096* (2013.01); *G06F 7/4988* (2013.01); *G06F 7/729* (2013.01); *G11C 11/4087* (2013.01)

(58) Field of Classification Search
CPC .... G11C 11/4096; G06F 7/4988; G06F 7/729
USPC .................................................. 365/189.011
See application file for complete search history.

(56) References Cited

U.S. PATENT DOCUMENTS

| | | |
|---|---|---|
| 7,395,404 B2 | 7/2008 | Gorobets |
| 10,992,314 B2 | 4/2021 | Olsen |
| 2001/0000661 A1 | 5/2001 | Miyamoto |
| 2009/0070727 A1 | 3/2009 | Solomon |
| 2011/0231465 A1 | 9/2011 | Phatak |
| 2015/0339103 A1 | 11/2015 | Olsen |
| 2019/0327074 A1 | 10/2019 | Jablonski |
| 2019/0339942 A1 | 11/2019 | Olsen |
| 2021/0117155 A1* | 4/2021 | Vasyltsov ............. G06F 7/4873 |
| 2021/0241085 A1 | 8/2021 | Najafi |
| 2023/0221927 A1 | 7/2023 | Law |
| 2024/0256475 A1* | 8/2024 | Chen ................. G06F 13/28 |
| 2024/0264948 A1* | 8/2024 | Trivedi ............... G06N 3/084 |

FOREIGN PATENT DOCUMENTS

| | | |
|---|---|---|
| CN | 113626858 A | 11/2021 |
| CN | 114581245 A | 6/2022 |
| CN | 115203191 A | 10/2022 |
| TW | I386801 | 2/2013 |
| TW | 202044083 A | 12/2020 |

OTHER PUBLICATIONS

Law, the specification, including the claims, and drawings in the U.S. Appl. No. 17/978,235, filed Nov. 1, 2022.
Law, the specification, including the claims, and drawings in the U.S. Appl. No. 17/978,981, filed Nov. 2, 2022.

* cited by examiner

*Primary Examiner* — Anthan Tran
(74) *Attorney, Agent, or Firm* — Winston Hsu

(57) ABSTRACT

A Compute-In-Memory (CIM) architecture includes a plurality of memories and a plurality of processing elements. Each of the processing elements has a look-up table unit configured to store values of a look-up table of a k-cluster residue number system, and output one of the values of the look-up table according to a first remainder and a second remainder as a result of a residue calculation. The look-up table unit receives the first remainder and the second remainder from one of the memories.

15 Claims, 13 Drawing Sheets

| ry \ rx | 1 | 2 | 3 |
|---|---|---|---|
| 1 | 1 | 1 | |
| 2 | 2 | 2 | 4 |
| 3 | 3 | 3 | 6 | 2 |
| 4 | 4 | 4 | 1 | 5 |
| 5 | 5 | 5 | 3 | |
| 6 | 6 | 6 | | |

FIG. 8

COMPUTE-IN-MEMORY ARCHITECTURE USING LOOK-UP TABLES

BACKGROUND OF THE INVENTION

1. Field of the Invention

The present invention is related to a Compute-In-Memory (CIM) architecture, and more particularly, to a Compute-In-Memory (CIM) architecture using look-up tables to improve overall performance with less power dissipation.

2. Description of the Prior Art

Compute-In-Memory (CIM) has become increasingly important for neural processing. By performing computations within the memory itself and supporting a large number of operations, CIM reduces data transfer and resolves the memory bandwidth bottleneck issue. This technology has the potential to significantly improve the speed and efficiency of neural processing systems.

Please refer to FIGS. 1 and 2. FIG. 1 is a schematic diagram of conventional Compute-In-Memory (CIM) architecture 10. FIG. 2 is a schematic diagram of a processing element (PE) 16 of the CIM architecture 10 shown in FIG. 1. The CIM architecture 10 is typically divided into two dies: a memory die 12 and a logic circuit die 14. The memory die 12 is stacked on top of the logic circuit die 14, allowing for direct data transfer from the memory die 12 to the logic circuit die 14. The logic circuit die 14 comprises a plurality of processing elements (PEs) 16. Each processing element (PE) 16 comprises a multiply-accumulate unit (MAC) 26 for performing computations, and a local memory 20 for temporarily storing data. The Network-on-Chip (NoC) approach is also applied to connect all PEs 16 and distribute data for parallel processing. Each of the PEs 16 further comprises an address register 18, a first register 22, and a second register 24. The address register 18 reads values from the local memory 20, the first register 22 stores one of the values read by the address register 18, and the second register 24 stores another value read by the address register 18. The MAC 26 computes the product of two values stored in the first register 22 and the second register 24.

The Compute-In-Memory platform is not limited to digital architecture but also supports analog architecture. Please refer to FIG. 3. FIG. 3 is a schematic diagram of a conventional analog processing element (PE) 30 in a Compute-In-Memory (CIM) architecture. The analog PE 30 comprises a plurality of digital-to-analog converters (DACs) 32, a local memory 34, a first register 36, a second register 38, an analog multiplier 40, and a plurality of analog-to-digital converters (ADCs) 42. The DACs 32 are used to convert digital data into analog signals. The analog signals are stored in the local memory 34, which is an analog memory. One of the analog signals is read from the local memory 34 by the first register 36, and another analog signal is read from the local memory 34 by the second register 38. The analog multiplier 40 performs a dot product operation on the two analog signals read by the first register 36 and the second register 38 and outputs a final result to the ADCs 42. The ADCs 42 converts the final result to the digital domain.

SUMMARY OF THE INVENTION

An embodiment of the present invention discloses a Compute-In-Memory (CIM) architecture, which comprises a plurality of memories and a plurality of processing elements. Each of the processing elements comprises a look-up table unit. The look-up table unit is configured to store values of a look-up table of a k-cluster residue number system, and output one of the values of the look-up table according to a first remainder and a second remainder as a result of a residue calculation. The look-up table unit receives the first remainder and the second remainder from one of the memories.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 8 shows a multiplication look-up table when a modular set of a k-cluster residue number system (k-RNS) according to an embodiment of the present invention includes 7.

DETAILED DESCRIPTION

The present invention provides a new Compute-In-Memory (CIM) architecture that uses the look-up table approach and can be fully integrated with memory. All computations are performed using the look-up table rather than logic gates. This approach also supports analog Compute-In-Memory and replaces the output ADC with a decoder to generate the memory address to access another memory look-up table. This is a true Compute-In-Memory architecture that not only simplifies the design but also improves overall performance with less power dissipation.

A look-up table (LUT) is a fast way to realize a complex function in digital logic. The address is the function input, and the value at that address is the function output. The advantage is that computing the function only takes a single memory look-up regardless of the complexity of the function, so it is very fast.

Figure 4:
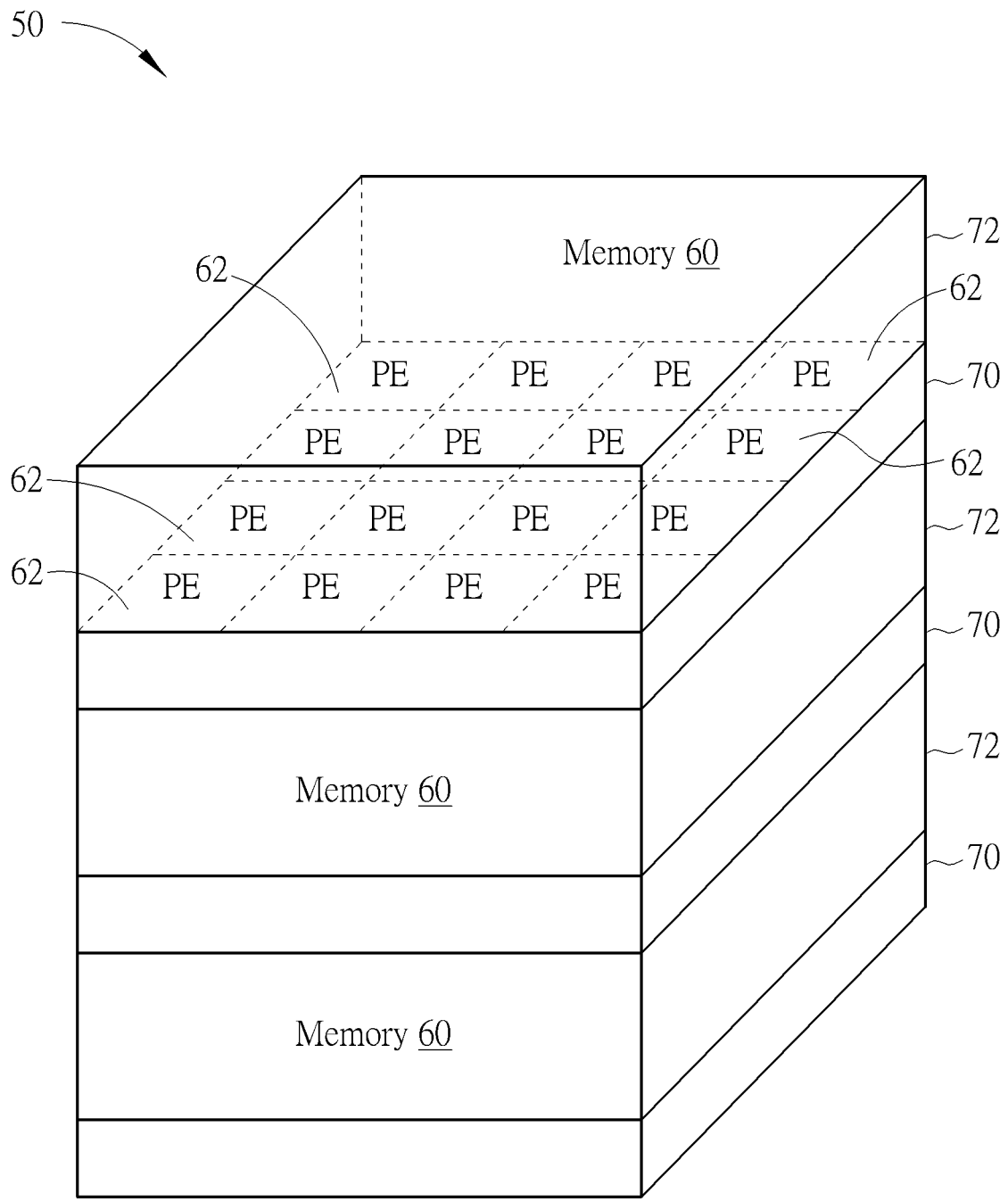
FIG. 4 is a schematic diagram of a Compute-In-Memory (CIM) architecture according to an embodiment of the present invention.
Figure 5:
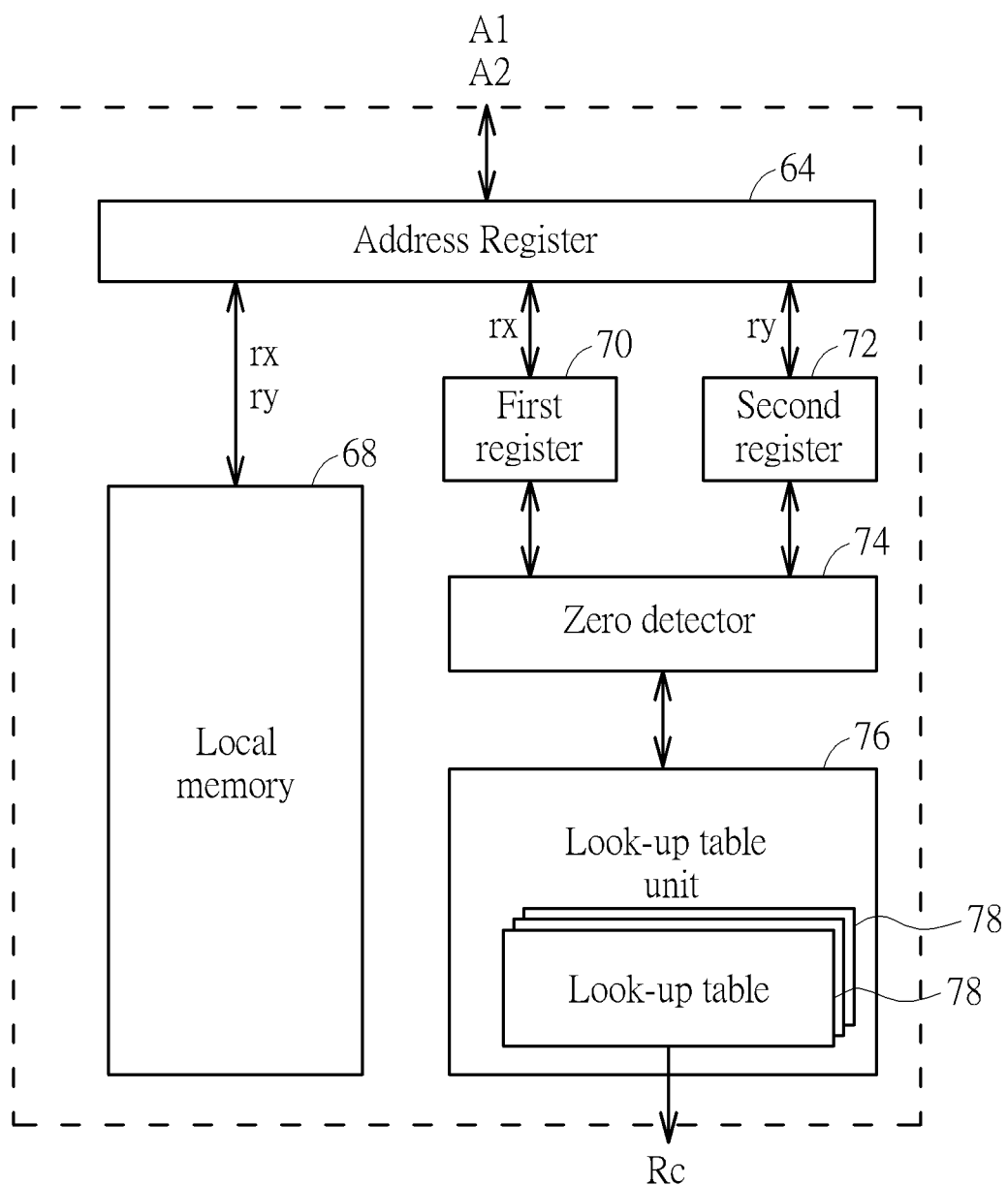
FIG. 5 is a schematic diagram of a processing element (PE) of the CIM architecture shown in FIG. 4.
Figure 6:
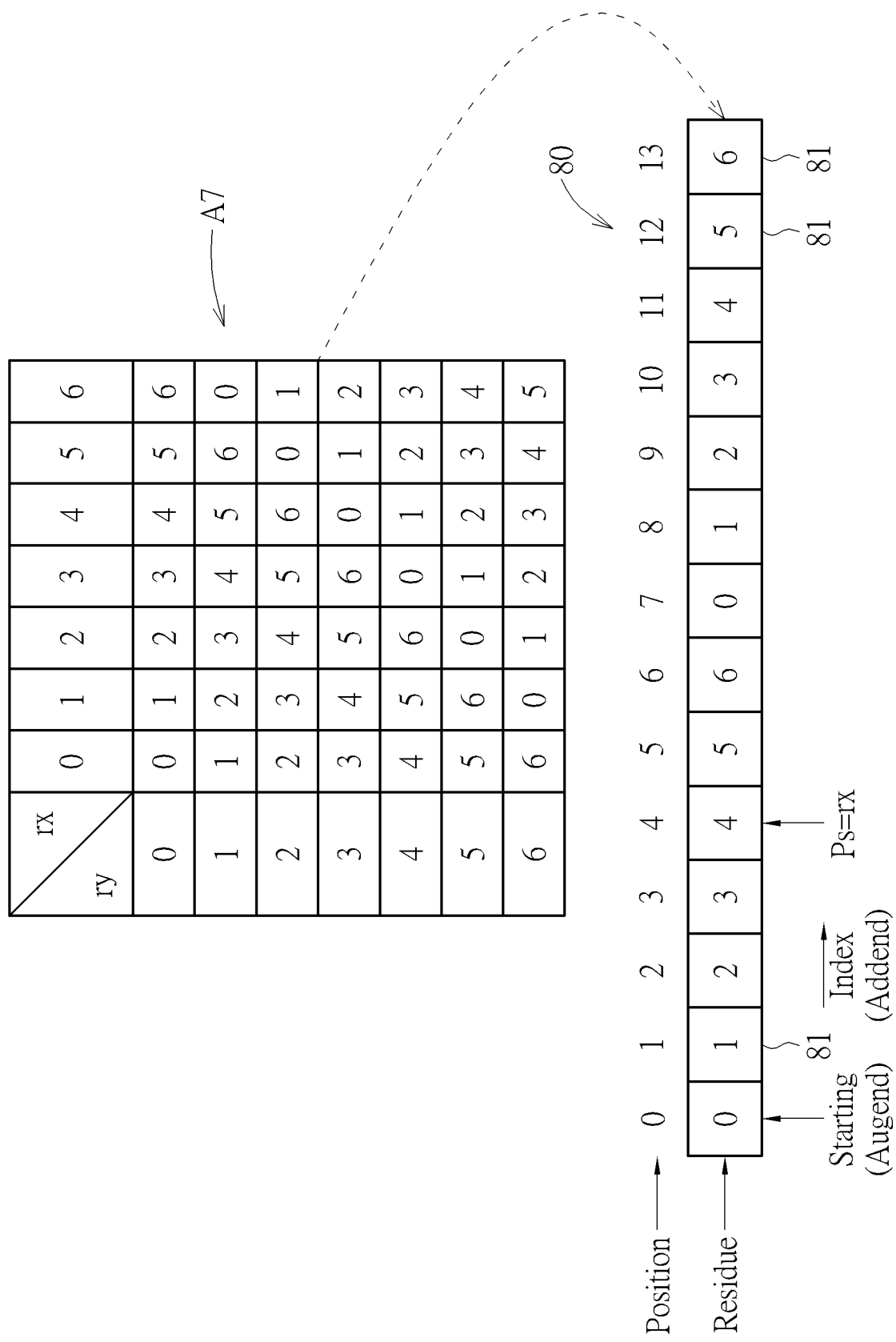
FIG. 6 is illustrated to explain how an addition and subtraction look-up table of the present invention is obtained by simplifying a traditional two-dimensional addition look-up table.
Figure 8:
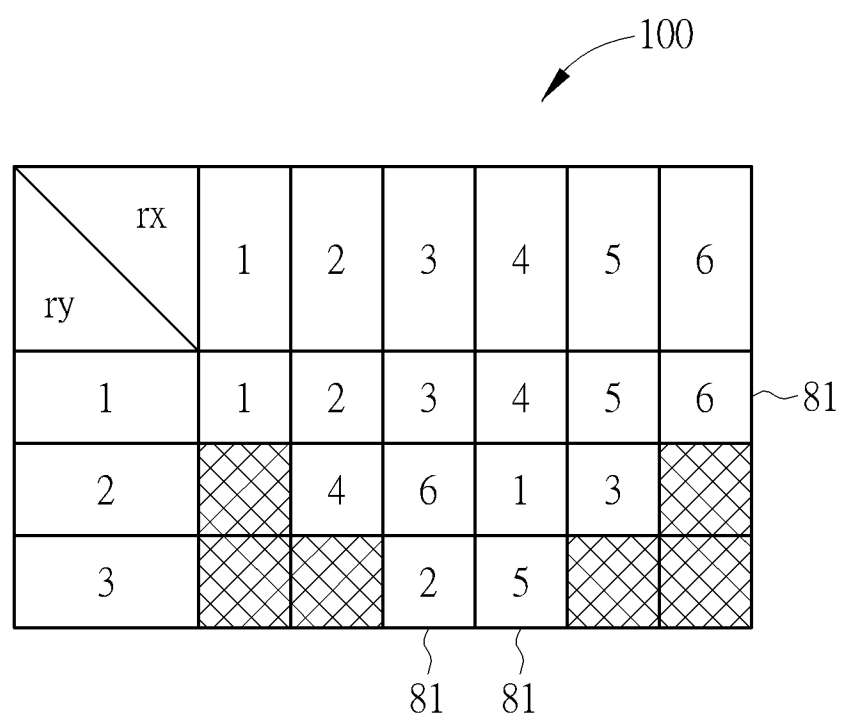

Please refer to FIGS. 4 and 5. FIG. 4 is a schematic diagram of a Compute-In-Memory (CIM) architecture 50 according to an embodiment of the present invention. FIG. 5 is a schematic diagram of a processing element (PE) 62 of the CIM architecture 50 shown in FIG. 4. The CIM architecture 50 comprises a plurality of processing elements (PEs) 62 and a plurality of memories 60. The plurality of processing elements 62 is formed in first layers 70, and the plurality of memories 60 is formed in second layers 72. The first layers 70 and the second layers 72 are alternatively staked. The first layers 70 are processing circuit layers, and the second layers 72 are memory layers. Each of the processing elements 62 comprises a look-up table unit 76. The look-up table unit 76 is configured to store values of a plurality of look-up tables 78 of a k-cluster residue number system, and output one of the values of the look-up tables 78 according to a first remainder rx and a second remainder ry as a result Rc of a residue calculation. The plurality of memories 60 is coupled to the processing elements 62 and configured to store values outputted from look-up table units 76 of the processing elements 62. The look-up table unit 76 receives the first remainder rx and the second remainder ry from one of the memories 60. The look-up tables 78 may comprise an addition and subtraction look-up table 80, as shown in FIG. 6, and a multiplication look-up table 100, as shown in FIG. 8.

Figure 1:
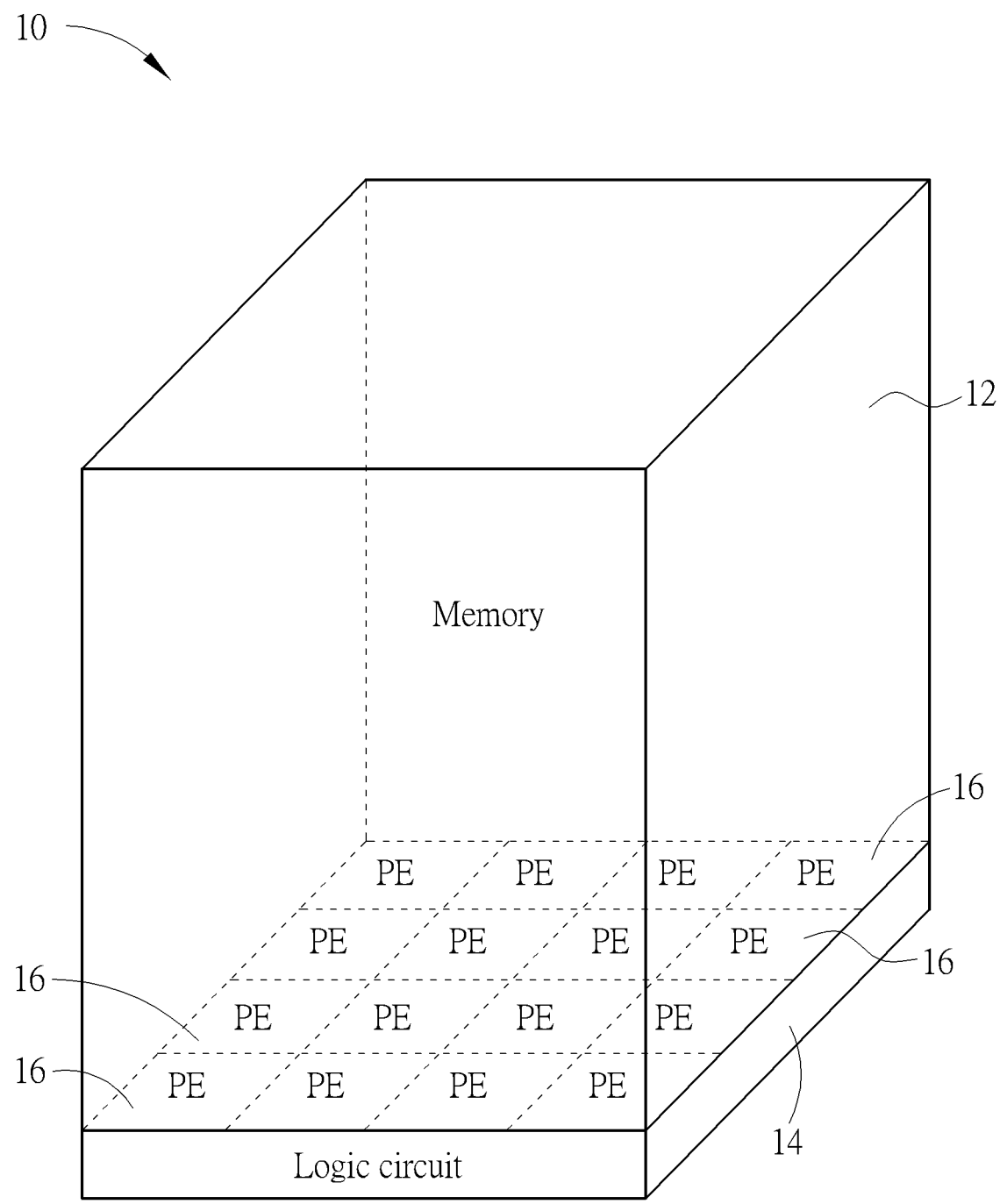
FIG. 1 is a schematic diagram of a conventional Compute-In-Memory (CIM) architecture.
Figure 2:
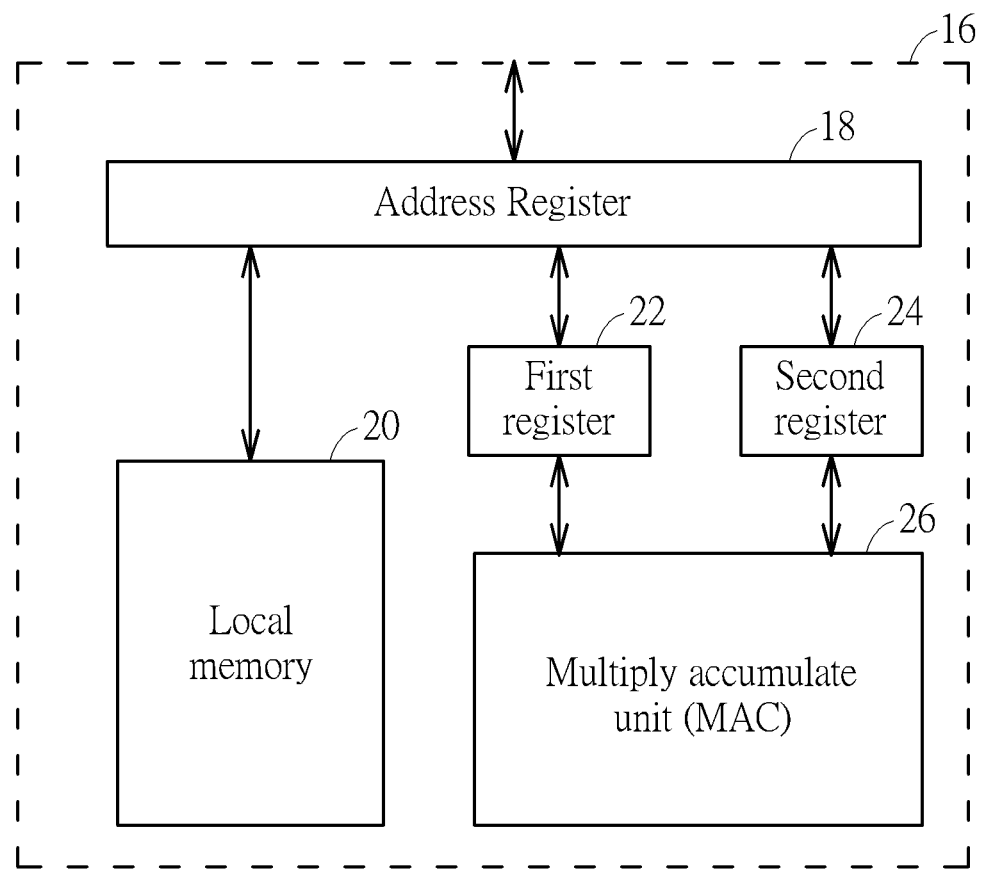
FIG. 2 is a schematic diagram of a processing element (PE) of the CIM architecture shown in FIG. 1.
Figure 3:
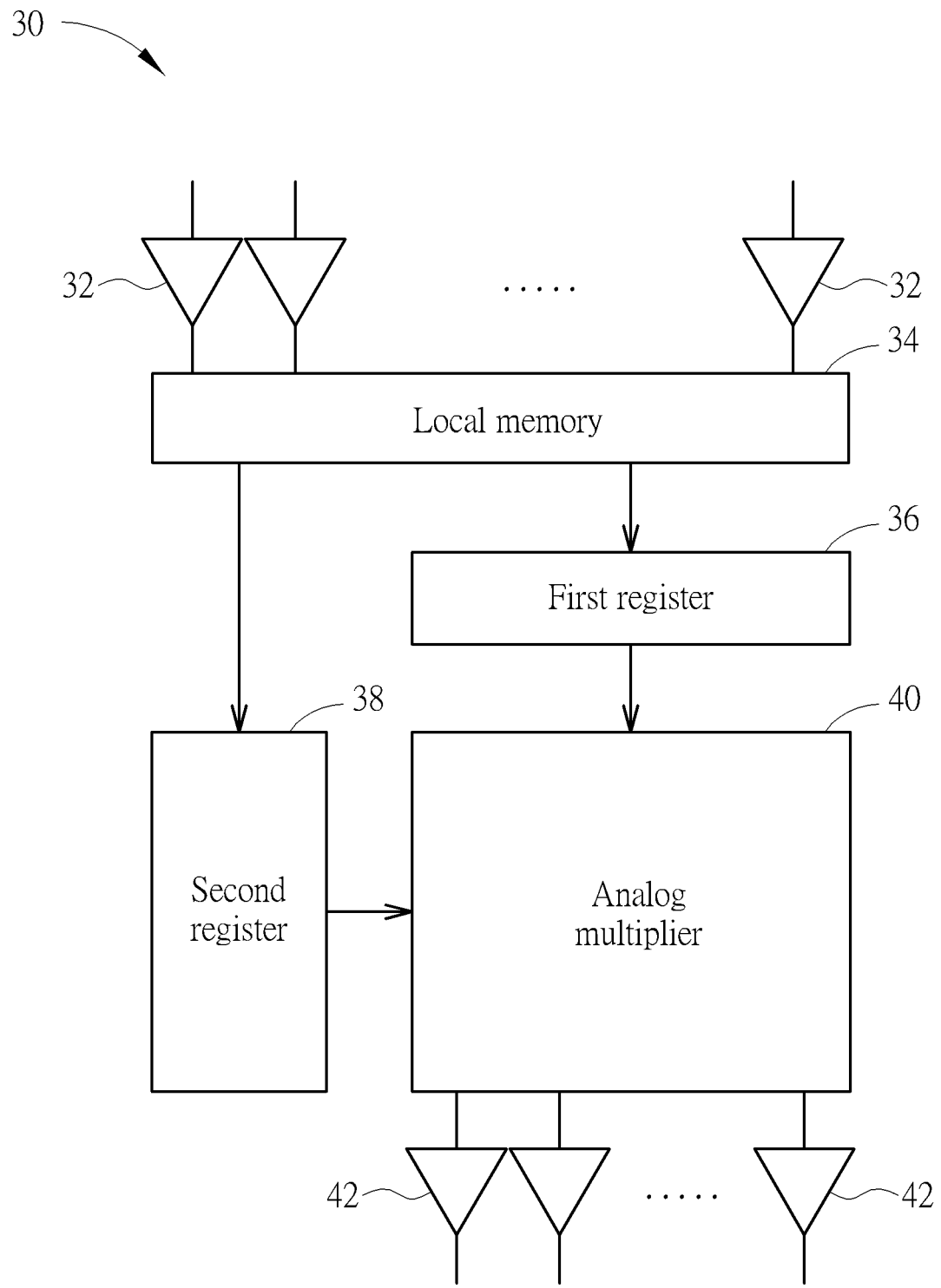
FIG. 3 is a schematic diagram of a conventional analog processing element in a Compute-In-Memory (CIM) architecture.

All computations of the CIM architecture 50 are performed by the look-up table units 76 of the processing elements 62 rather than logic gates. Accordingly, as compared with the conventional CIM architecture 10 shown in FIG. 1, the CIM architecture 50 has improved overall performance and less power dissipation. Moreover, since the first layers 70 and the second layers 72 are alternatively staked, data transfer paths could be reduced to significantly improve the speed and efficiency of the CIM architecture 50.

Each of the processing elements 62 may further comprise a local memory 68, an address register 64, a first register 70, and a second register 72. The local memory 68 is configured to temporarily store data. The address register 64 is configured to read the first remainder rx from the local memory 68 according to a first address A1 and read the second remainder ry from the local memory 68 according to a second address A2. The first register 70 is configured to store the first remainder rx. The second register 72 is configured to store the second remainder ry.

The CIM architecture 50 is used to establish a Residue Number System (RNS). The RNS is a number system, which first defines a modular set and transforms the numbers to their integer remainders (also called residues) through modulo division, then performs the arithmetic operations (addition, subtraction, and multiplication) on the remainders only. For example, the modular set is defined as (7, 8, 9) with the numbers 13 and 17. The dynamic range is defined by the product of the modular set with the range 504, i.e., 7×8×9. It first transforms the numbers to their residue through modulo operations 13→(6, 5, 4) and 17→(3, 1, 8), then performs addition and multiplication on residues only, (6, 5, 4)+(3, 1, 8)=(9, 6, 12)→(2, 6, 3), which is equal to 30. (6, 5, 4)*(3, 1, 8)=(18, 5, 32)→(4, 5, 5), which is equal to 221. Since the remainder magnitude is much smaller, it only requires simple logic for parallel computations.

For the sake of clarity, the dynamic range of the RNS may be defined as the following equation (1):

$$M = \prod_{i=0}^{n} m_i \tag{1}$$

where:
M is the dynamic range of the RNS; and
mi is the ith modulus of the modular set (m0, m1, ..., mn) of the RNS.

All the arithmetic operations of the RNS of the CIM architecture 50 can be implemented using look-up tables 78 for parallel distributed computing. However, the memory requirement may be an important issue in using look-up tables in the RNS. The required size of memory is dependent on the square of each modulus as well as the number of bits of the modulus and can be presented as the following equation (2):

$$Mem = \sum_{i=0}^{n} m_i^2 \times b_i \tag{2}$$

where:
Mem is the required size of memory;
mi is the ith modulus; and
bi is the number of bits of the ith modulus.

For example, it chooses the RNS modular set as (15, 17) with the dynamic range M=15×17=255. Since the first modulus (i.e., 15) has a 4-bit length and the second modulus (i.e., 17) has a 5-bit length, for all three arithmetic (i.e., addition, subtraction, and multiplication) operations, the total memory requirement is estimated to be $3 \times (15^2 \times 4 + 17^2 \times 5) = 7035$ bits. The area is too large compared with the logic gate design (e.g., the processing elements (PEs)) of the RNS.

To represent an n-bit integer and its negative using a k-cluster residue number system (k-RNS) of the CIM architecture 50, it first defines a modular set of P coprime integers as $(m_0, m_1, \ldots, m_p)$ where a dynamic range is generated according to the product of the modular set $(m_0, m_1, \ldots, m_p)$. For example, when a modular set of 3 coprime integers is chosen to be $(2^{n/2}-1, 2, 2^{n/2}+1)$, the dynamic range is set to $[-(2^n-1), (2^n-2)]$. The modular set is not limited to 3 coprime integers.

The processing element 62 uses one of the look-up tables 78 to perform addition operations and subtraction operations. The look-up table 78 used by the processing element 62 to perform addition and subtraction operations may be called the "addition and subtraction look-up table". According to the division algorithm, the following equation (3) in an integral domain could be transformed into the following equation (4) in a remainder domain:

$$Z = X + Y \tag{3}$$

$$rz = rx + ry \tag{4}$$

where:
X, Y, and Z are three integers;
rx is equal to (X mod $m_i$);
ry is equal to (Y mod $m_i$);
rz is equal to (Z mod $m_i$); and $m_i$ is selected from the modular set of the k-cluster residue number system.

FIG. 6 is illustrated to explain how an addition and subtraction look-up table 80 of the CIM architecture 50 is obtained by simplifying a traditional two-dimensional addition look-up table A7. The addition and subtraction look-up table 80 is one of the look-up tables 78 shown in FIG. 5 and simplified from the traditional two-dimensional addition look-up table A7. In the embodiment, one modulus of the modular set selected by the processing element 62 is 7. The addition and subtraction look-up table 80 is composed of 14 (i.e., 2×7) cells 81 for recording values from zero to 6 in an ascending order twice. The addition and subtraction look-up table 80 is a one-dimensional linear array, which is simplified from the traditional two-dimensional addition look-up table A7 for addition operations based on modulus 7. The traditional addition look-up table A7 comprises 49 (i.e., 7×7) cells, more than fourteen cells 81 of the addition and subtraction look-up table 80. Each of the cells 81 is used to store a residue when an addition operation on two remainders rx and ry or two integers X and Y is performed, where rx=(X mod 7) and ry=(Y mod 7). The addition look-up table A7 is transformed into the addition and subtraction look-up table 80 based on the periodic behaviors of the modulo. As shown in FIG. 6, the sum stored in each cell of the addition look-up table A7 differs by one from the adjacent one. Therefore, the addition look-up table A7 could be simplified and transformed into the addition and subtraction look-up table 80. The remainder rx (i.e., the augend) may be used as the table entry, and the remainder ry (i.e., the addend) may be used as the table index in ascending order to retrieve the result. In the embodiment, a start position Ps would be set to be equal to the augend rx, and the start position Ps would be shifted according to the addend ry. In detail, when the addition operation on two integers X and Y is performed, a value recorded in cell 81 at position Q of the addition and subtraction look-up table 80 is retrieved as the result of the addition operation, where Q=((X mod $m_i$)+ (Y mod $m_i$))= (rx+ry), and $m_i$ is the modulus. Since $m_i$=7, (X mod $m_i$)=(X mod 7)=rx, and (Y mod $m_i$)=(Y mod 7)=ry, Q=(rx+ry). For example, when rx=4 and ry=5, the start position Ps is set to 4, and the Ps is shifted to 5, the value recorded in cell 81 at position 9 (i.e., 4+5=9) would be retrieved as the result of (rx+ry).

Similarly, according to the subtraction algorithm, the following equation (5) in the integral domain could be transformed into the following equation (6) in the remainder domain:

$$Z = X - Y \quad (5)$$

$$rz = rx - ry \quad (6)$$

Therefore, the addition and subtraction look-up table 80 could be used for addition operations and subtraction operations. A sum of the remainder rx (i.e., the minuend) and the modulus $m_i$ may be used as the table entry, and the remainder ry (i.e., the subtrahend) may be used as the table index in descending order to retrieve the result. In the embodiment, a start position Ps would be set to be equal to the sum of the minuend rx and the modulus $m_i$, i.e. (rx+$m_i$), and the start position Ps would be shifted according to the subtrahend ry. In detail, when the subtraction operation on two integers X and Y is performed, a value recorded in cell 81 at position R of the addition and subtraction look-up table 80 is retrieved as the result of the subtraction operation, where R=($m_i$+ (X mod $m_i$)–(Y mod $m_i$))=($m_i$+rx –ry). Since $m_i$=7, (X mod $m_i$)=(X mod 7)=rx, and (Y mod $m_i$)=(Y mod 7)=ry, R=($m_i$+rx–ry). For example, when we subtract 5 with 4, the table entry becomes (5+7)=12, where 7 is equal to $m_i$, then, it shifts to the left by 4, the value recorded in the cell 81 at position 8 is defined as 1, it matches the result of (rx-ry)=1.

Figure 7:
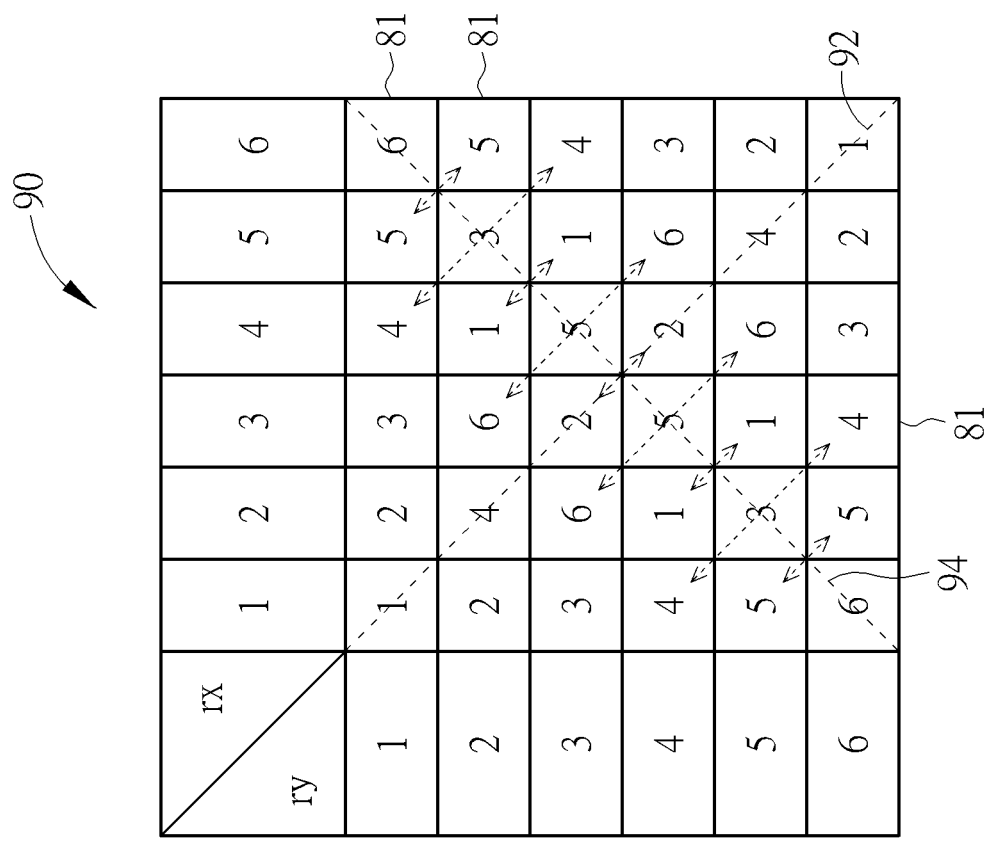
FIG. 7 shows a temporary multiplication look-up table according to an embodiment of the present invention.

FIG. 7 shows a temporary multiplication look-up table 90 according to an embodiment of the present invention. A product of two integers X and Y would be zero if one of two integers X and Y is zero, so all cells whose value is equal to zero in a multiplication look-up table could be eliminated. Accordingly, the data amount of the temporary multiplication look-up table 90 could be presented as the following equation (7):

$$Mem2 = \sum_{i=0}^{n}(m_i - 1)^2 \times b_i \quad (7)$$

where:
Mem2 is the data amount of the temporary multiplication look-up table 90;
$m_i$ is the $i^{th}$ modulus; and
$b_i$ is the number of bits of the $i^{th}$ modulus.

According to equations (2) and (7), the look-up table size is reduced from $$\sum_{i=0}^{n} m_i^2$$

to $$\sum_{i=0}^{n}(m_i - 1)^2.$$

Moreover, according to the multiplication commutative rule, the order of the multiplicand and multiplicator can be exchanged. Therefore, the products of the temporary multiplication look-up table 90 could be mirrored along a Top-Left and Bottom-Right (TL/BR) diagonal line 92 and along with a Top-Right and Bottom-Left (TR/BL) diagonal line 94, as shown in FIG. 7. Therefore, the temporary multiplication look-up table 90 can be partitioned into four identical regions to reduce the table size. Accordingly, the look-up table size for multiplication operations may be further reduced from $$\sum_{i=0}^{n}(m_i - 1)^2$$

to $$\sum_{i=0}^{n}(m_i^2 - 1)/4.$$

FIG. 8 shows a multiplication look-up table 100 when the modular set of the k-RNS includes 7. The multiplication look-up table 100 is one of the look-up tables 78 shown in FIG. 5 and simplified from the temporary multiplication look-up table 90. The multiplication look-up table 100 has twelve cells 81 while the temporary multiplication look-up table 90 has thirty-six cells 81. Therefore, the look-up table size for multiplication operations is further reduced. Due to the mirror property and the periodic behaviors of the modulo, the four identical regions of the temporary multiplication look-up table 90 could be simplified as a multiplication look-up table 100, as shown in FIG. 8. The multiplication look-up table 100 is corresponding to modulus 7 (i.e., $m_i=7$). The processing element 62 may generate a multiplication look-up table 100 for each coprime integer of the modular set, and a multiplication look-up table for the coprime integer $m_i$ is composed of S cells 81, where $$S = \left(\frac{m_i^2 - 1}{4}\right).$$

Accordingly, the data amount of the multiplication look-up table 100 could be presented as the following equation (8):

$$Mem3 = \sum_{i=0}^{n}\left(\frac{m_i^2 - 1}{4}\right) \times b_i \qquad (8)$$

where:
Mem3 is the data amount of the multiplication look-up table 100;
$m_i$ is the $i^{th}$ modulus; and
$b_i$ is the number of bits of the $i^{th}$ modulus.

Please refer to FIG. 5. In an embodiment of the present invention, each of the processing elements 62 further comprises a zero detector 74, coupled between the look-up table unit 76 and the first register 70 and the second register 72, for detecting whether any of the first remainder rx and the second remainder ry is zero. Therefore, each processing element 62 employs the zero detector 74 to skip zero for ineffectual operation. Moreover, since the magnitude of the residue is much smaller than the original integer, the zero detector 74 can be easily implemented using a simple NOR gate. This approach allows for efficient detection of zero values within the system, improving overall performance and reducing power consumption.

The look-up tables 78 of the look-up table unit 76 may include an overflow table, and the processing element 62 uses the overflow table to detect overflow of addition-subtraction operations and multiplication operations. Unlike the binary system, it is not required to extend the binary number to accommodate the overflow. This approach using the overflow table can keep the lookup table size. More information about the overflow detection may refer to U.S. patent application Ser. No. 17/878,235, filed on Nov. 27, 2022.

Figure 9:
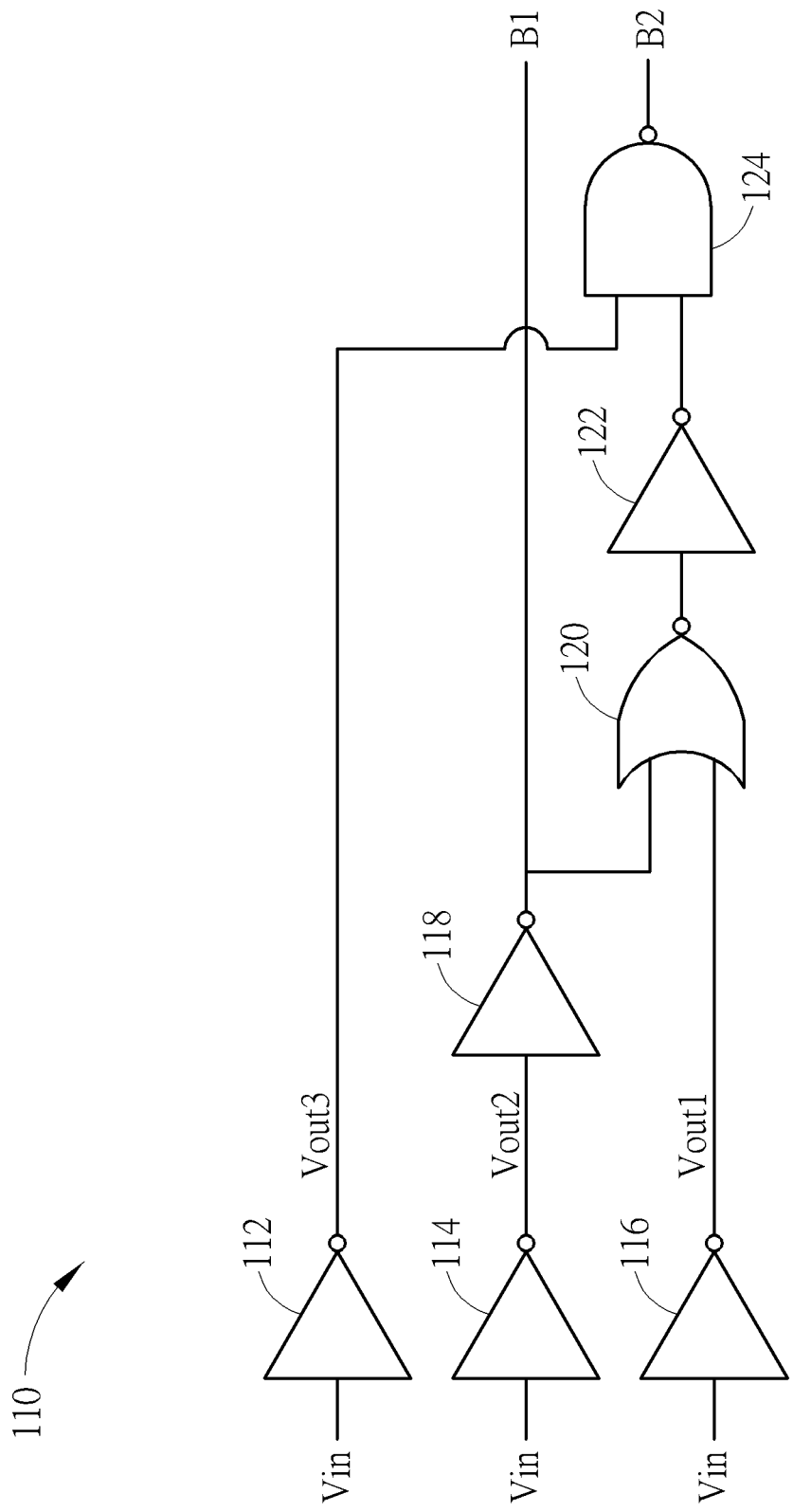
FIG. 9 is a circuit diagram of a decoder of the memory of the processing element in FIG. 5.

The approach of the present invention supports analog Compute-In-Memory and replaces the output ADC with a decoder to generate the memory address to access another memory look-up table. In an embodiment of the present invention, each of the memories 60 may be an analog memory and comprises a decoder 110 shown in FIG. 9. In FIG. 9, it shows the 2 bits decoder 110, the decoder can be modified to support multiple bits (i.e., 4 bits, 8 bits, etc.) decoding. In other words, each cell of the memories 60 for storing data may be a multi-level cell (MLC), triple-level cell (TCL), quad-level cell (QLC), and so on. Each decoder 110 is used to decode the analog signal Vin output from one of the memories 60 into digital signals B1 and B2. The decoder 110 comprises inverters 112, 114, 116, 118, and 122, a NOR gate 122, and a NAND gate 124. The input ends of inverters 112, 114, and 116 receive the analog signal Vin output from one of the memories 60. The threshold voltages of inverters 112, 114, and 116 are Vt3, Vt2, and Vt1 respectively. The threshold voltages Vt3, Vt2, and Vt1 are different. Therefore, the outputs Vout3, Vout2, and Vout1 of the inverters 112, 114, and 116 may be different due to the different threshold voltages Vt3, Vt2, and Vt1. An input end of inverter 118 is coupled to an output end of inverter 114. The first input end of the NOR gate 120 is coupled to the output end of inverter 118, and a second input end of the NOR gate 120 is coupled to the output end of inverter 116. An input end of the inverter 122 is coupled to an output end of the NOR gate 120. The first end of the NAND gate 124 is coupled to an output end of inverter 112, and the second end of the NAND gate 124 is coupled to an output end of inverter 122. The output end of inverter 118 outputs the digital signal B1, and the output end of the NAND 124 outputs the digital signal B2. Each of the digital signals B1 and B2 represents one bit.

Figures 10, 11:
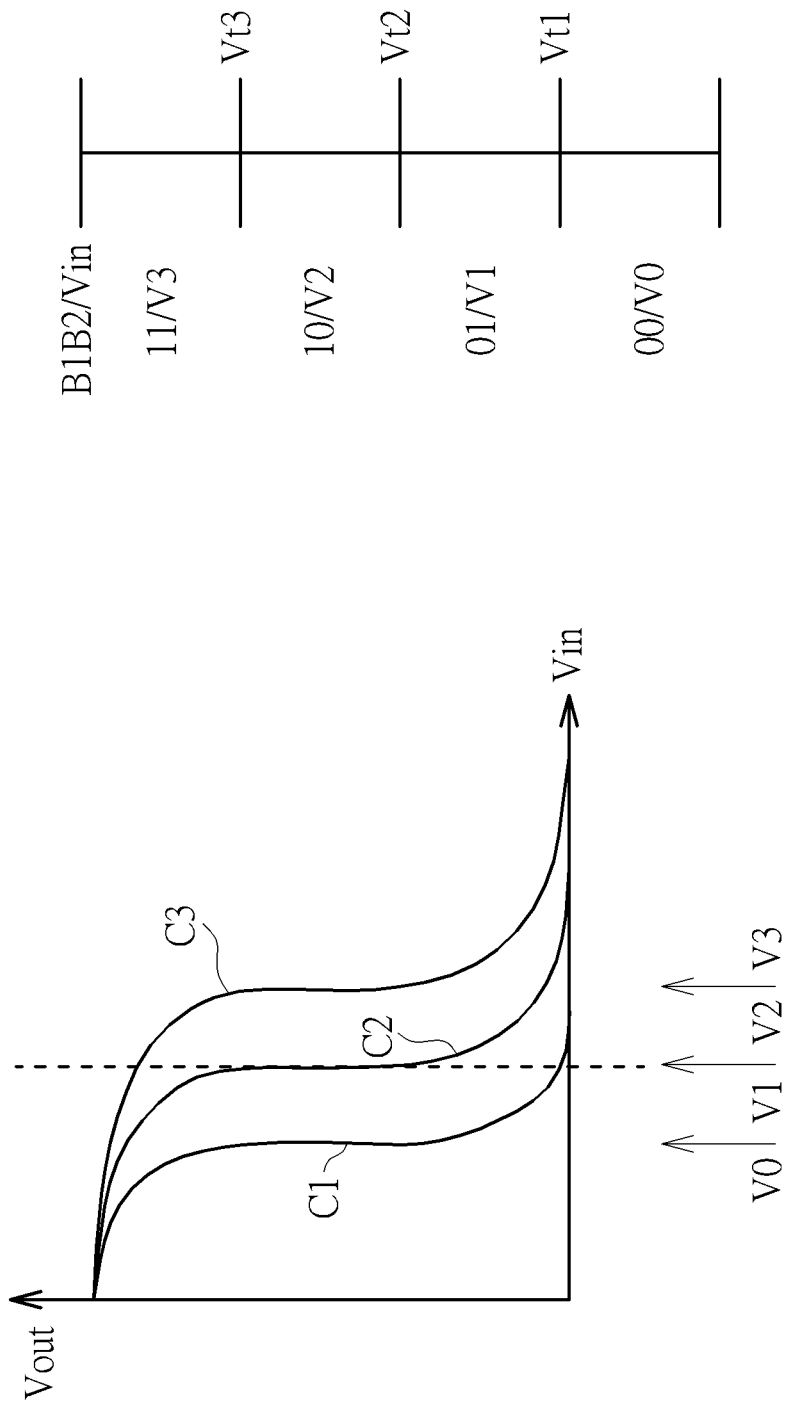
FIG. 10 is a relationship diagram of analog signals Vin and the outputs of the three inverters 112, 114, and 116 in FIG. 9.
FIG. 11 shows the digital signals B1 and B2 outputted from the decoder in FIG. 9 when the analog signal Vin is at different voltage levels.

FIG. 10 shows three curves C1, C2, and C3 to respectively represent the relationship between the analog signals Vin and the outputs Vout1, Vout2, and Vout3 of the inverters 116, 114, and 112. Curve C1 represents the relationship between the analog signal Vin and the output Vout1 of the inverter 116, the curve C2 represents the relationship between the analog signal Vin and the output Vout2 of the inverter 114, and the curve C3 represents the relationship between the analog signal Vin and the output Vout3 of the inverter 112. FIG. 11 shows the digital signals B1 and B2 output from the decoder 110 when the analog signal Vin is at different voltage levels V0, V1, V2, and V3. When the analog signal Vin is equal to V0, the digital signals B1 and B2 are "0" and "0" respectively. When the analog signal Vin is equal to V1, the digital signals B1 and B2 are "0" and "1" respectively. When the analog signal Vin is equal to V2, the digital signals B1 and B2 are "1" and "0" respectively. When the analog signal Vin is equal to V3, the digital signals B1 and B2 are "1" and "1" respectively. Where V3>Vt3>V2>Vt2>V1>Vt1>V0. A truth table of the decoder 110 is as follows:

| | Component of the decoder | | | | | | |
|---|---|---|---|---|---|---|---|
| | 112 | 114 | 116 | 118 (B1) | 120 | 122 | 124 (B2) |
| Vin > Vt3 | 0 | 0 | 0 | 1 | 0 | 1 | 1 |
| Vt3 > Vin > Vt2 | 1 | 0 | 0 | 1 | 0 | 1 | 0 |
| Vt2 > Vin > Vt1 | 1 | 1 | 0 | 0 | 1 | 0 | 1 |
| Vt1 > Vin | 1 | 1 | 1 | 0 | 0 | 1 | 0 |

Figure 13:
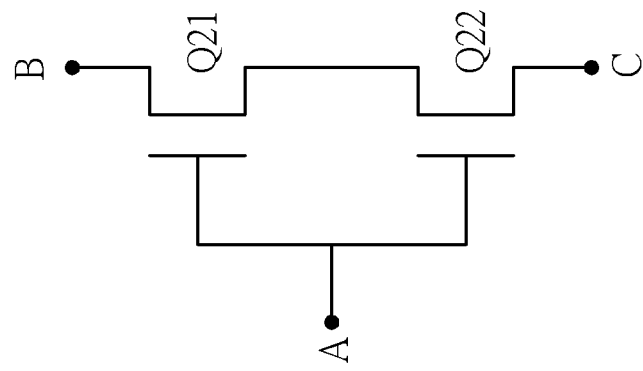
FIG. 13 is a circuit diagram of two cascaded NMOS transistors used to replace an NMOS transistor Q2 in FIG. 12.
Figure 12:
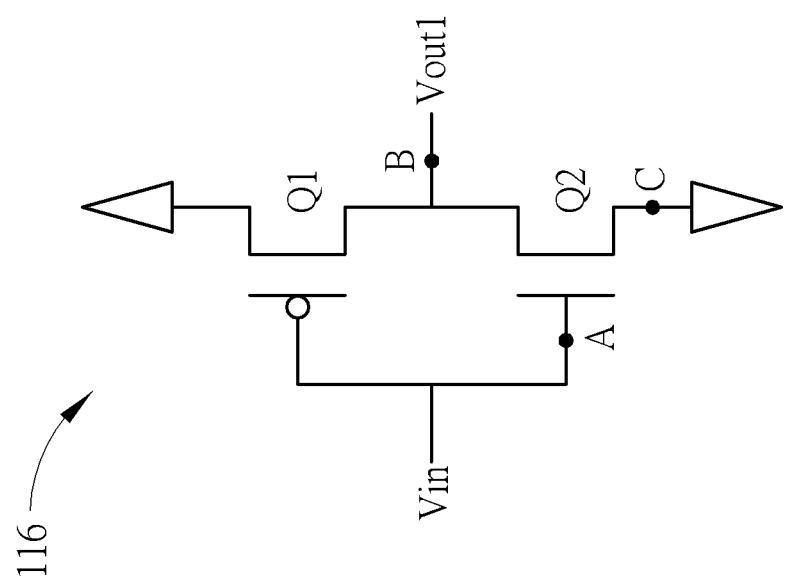
FIG. 12 is a circuit diagram of the inverter 116 in FIG. 9.

Since the inverters 112, 114 and 116 have different threshold voltages Vt3, Vt2, and Vt1, the decoder 110 could decode the analog signal Vin output from one of the memories 60. The threshold voltages Vt3, Vt2, and Vt1 could be adjusted by changing the transistor size or cascading two or more transistors together to alter the saturation current thereof. FIG. 12 shows a circuit diagram of the inverter 116 of the decoder 110 according to an embodiment of the present invention. The inverter 116 comprises a PMOS transistor Q1 and an NMOS transistor Q2. The gates of the PMOS transistor Q1 and the NMOS transistor Q2 receives the analog signal Vin, and drains of the PMOS transistor Q1 and the NMOS transistor Q2 are coupled to an output end of the inverter 116 to output the output Vout1. Another inverter 114 of the decoder 110 may be implemented by replacing the NMOS transistor Q2 with two cascaded NMOS transistors Q21 and Q22 shown in FIG. 13, and the nodes A, B and C in FIGS. 12 and 13 are used to indicate the connection nodes when the NMOS transistor Q2 is replaced by the NMOS transistors Q21 and Q22. Therefore, the inverter 114 may comprise the PMOS transistor Q1 and two cascaded NMOS transistors Q21 and Q22. The gates of the two cascaded NMOS transistors Q21 and Q22 and the gate of the PMOS transistor Q1 of the inverter 114 are coupled to the input end of the inverter 114 to receive the analog signal Vin, and the drain of the PMOS transistor Q1 of the inverter 114 and an end of the two cascaded NMOS transistors Q21 and Q22 (i.e., the node B) are coupled to the output end of the inverter 114 to output the output Vout2.

Since the NMOS transistors, Q21 and Q22 are cascaded, the threshold voltage Vt2 of the inverter 114 would be greater than the threshold voltage Vt1 of the inverter 116. Similarly, the inverter 112 of the decoder 110 may be implemented by replacing the NMOS transistor Q2 with three or more cascaded NMOS transistors, such that the threshold voltage Vt3 of the inverter 112 would be greater than the threshold voltages Vt1 and Vt2.

Figure 15:
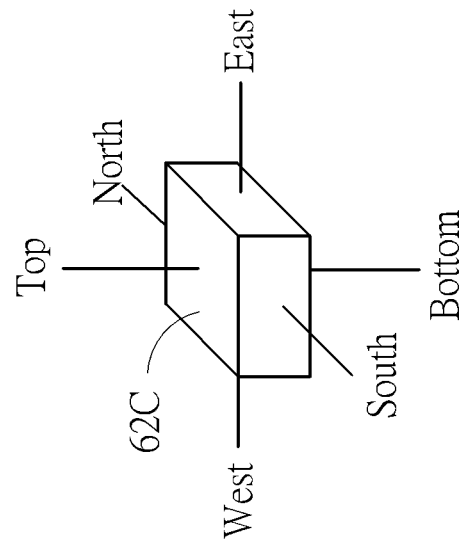
FIG. 14 and FIG. 15 show a six-way neural network according to an embodiment of the present invention.
Figure 14:
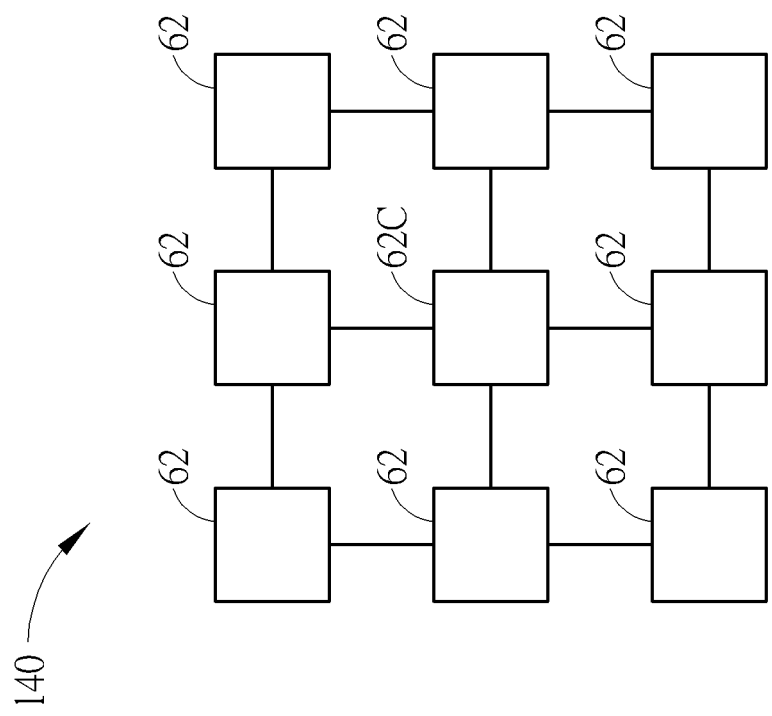
Figure 17:
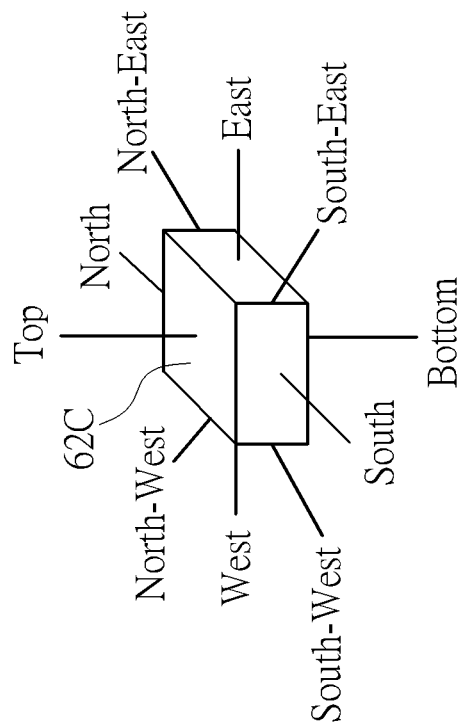
FIG. 16 and FIG. 17 show a ten-way neural network according to an embodiment of the present invention.
Figure 16:
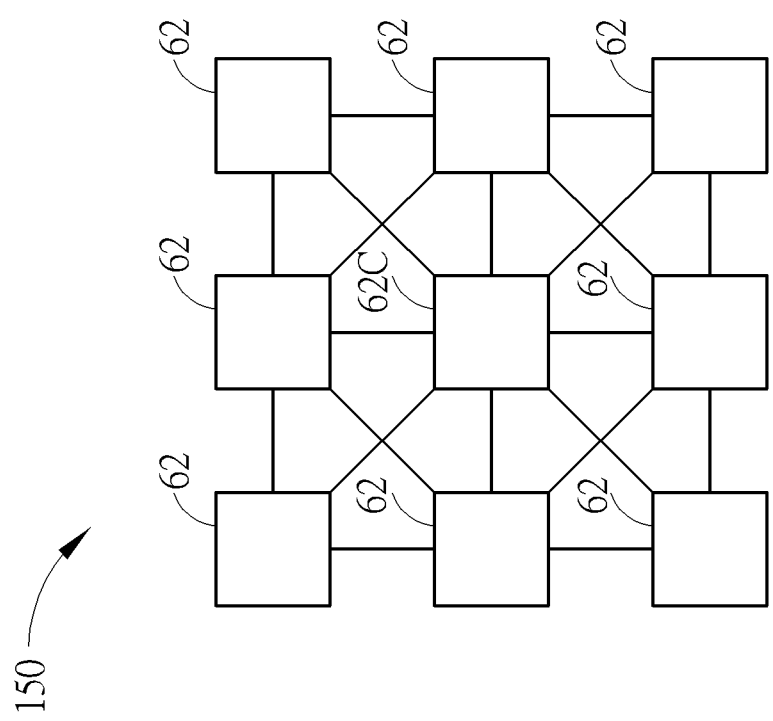

The processing elements 62 of the CIM architecture 50 may form a six-way or a ten-way neural network. FIGS. 14 and 15 show the six-way neural network 140, and FIGS. 16 and 17 show the ten-way neural network 150. As shown in FIGS. 14 and 15, each central processing element 62C of the processing elements 62 is linked to the other six processing elements 62. As shown in FIGS. 16 and 17, each central processing element 62C of the processing elements 62 is linked to the other ten processing elements 62. FIGS. 14 and 16 are top-view diagrams of the six-way neural network 140 and the ten-way neural network 150 respectively. FIG. 15 illustrates a single central processing element 62C and the directions of the six-way neural network 140: top, bottom, north, south, east, and west. FIG. 17 illustrates a single central processing element 62C and the directions of the ten-way neural network 150: top, bottom, north, south, east, west, north-east, north-west, south-east, and south-west. Each of the directions indicates the location of a processing element 62 connected with the central processing element 62C. The ten-way neural network 150 of the CIM architecture 50 would consist of ten processing elements 62, which work together to perform computations. The ten-way neural network 150 may also be termed as "ten-way switch".

The present invention introduces a new Compute-In-Memory (CIM) architecture that utilizes a look-up table approach and can be fully integrated with memory. All computations are performed using look-up tables instead of logic gates. The CIM architecture of the present invention not only simplifies the design but also improves overall performance while reducing power dissipation.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A Compute-In-Memory (CIM) architecture, comprising:
   a plurality of memories; and
   a plurality of processing elements, each of the processing elements comprising:
   a look-up table unit for storing values of a look-up table of a k-cluster residue number system, and outputting one of the values of the look-up table according to a first remainder and a second remainder as a result of a residue calculation, wherein the look-up table unit receives the first remainder and the second remainder from one of the memories.

2. The Compute-In-Memory architecture of claim 1, wherein each of the processing elements further comprises:
   a local memory for temporarily storing data;
   an address register for reading the first remainder from the local memory according to a first address and reading the second remainder from the local memory according to a second address;
   a first register for storing the first remainder; and
   a second register for storing the second remainder.

3. The Compute-In-Memory architecture of claim 2, wherein each of the processing elements further comprises a zero detector, coupled between the look-up table unit and the first register and the second register, for detecting whether any of the first remainder and the second remainder is zero.

4. The Compute-In-Memory architecture of claim 1, wherein the plurality of processing elements is formed in a plurality of first layers, the plurality of memories are formed in a plurality of second layers, and the first layers and the second layers are alternatively staked.

5. The Compute-In-Memory architecture of claim 1, wherein the processing elements form a ten-way switch, and each central processing element of the ten-way switch is linked to the other ten processing elements of the processing elements.

6. The Compute-In-Memory architecture of claim 5, wherein the central processing element of the ten-way switch is connected to the other ten processing elements in directions of up, down, north, south, east, west, north-east, north-west, south-east, and south-west.

7. The Compute-In-Memory architecture of claim 1, wherein the look-up table unit is further used for storing an addition and subtraction look-up table, the addition and subtraction look-up table comprising $2 m_i$ cells for recording values from zero to $(m_i-1)$ in an ascending order twice, wherein $m_i$ is a coprime integer of a modular set of the k-cluster residue number system.

8. The Compute-In-Memory architecture of claim 7, wherein look-up table unit retrieves a value recorded in a cell at position R of the addition and subtraction look-up table when performing an addition operation on the first remainder and the second remainder, where $Q=(rx+ry)$, rx is the first remainder, ry is the second remainder, and the first remainder and the second remainder are integers.

9. The Compute-In-Memory architecture of claim 7, wherein look-up table unit retrieves a value recorded in a cell at position R of the addition and subtraction look-up table when subtracting the first remainder by the second remainder, where $R=(m_i+rx-ry)$, rx is the first remainder, ry is the second remainder, and the first remainder and the second remainder are integers.

10. The Compute-In-Memory architecture of claim 1, wherein the look-up table unit is further used for storing a multiplication look-up table for a coprime integer $m_i$ of a modular set of the k-cluster residue number system, the coprime integer $m_i$ is not 2, and the multiplication look-up table is composed of S cells, $$S = \left(\frac{m_i^2 - 1}{4}\right).$$

11. The Compute-In-Memory architecture of claim 1, wherein the look-up table unit is further used for storing an overflow table for overflow detection of addition-subtraction operations and multiplication operations.

12. The Compute-In-Memory architecture of claim 1, wherein each memory comprises a decoder configured to decode an analog signal outputted from each multi-value analog memory into at least two bits, and the decoder supports multiple bits decoding.

13. The Compute-In-Memory architecture of claim 12, wherein the decoder comprises:
 a first inverter, having an input end for receiving the analog signal;
 a second inverter, having an input end for receiving the analog signal; and
 a third inverter, having an input end for receiving the analog signal,
 wherein a first threshold voltage of the first inverter is less than a second threshold voltage of the second inverter, and the second threshold voltage of the second inverter is less than a third threshold voltage of the third inverter.

14. The Compute-In-Memory architecture of claim 13, wherein the first inverter comprises a PMOS transistor and an NMOS transistor, gates of the PMOS transistor and the NMOS transistor receive the analog signal, and drains of the PMOS transistor and the NMOS transistor are coupled to an output end of the first inverter;
 wherein the second inverter comprises a PMOS transistor and two cascaded NMOS transistors, gates of the two cascaded NMOS transistors and a gate of the PMOS transistor of the second inverter receive the analog signal, and a drain of the PMOS transistor of the second inverter and an end of the two cascaded NMOS transistors are coupled to an output end of the second inverter; and
 wherein the third inverter comprises a PMOS transistor and three or more cascaded NMOS transistors.

15. The Compute-In-Memory architecture of claim 13, wherein the decoder further comprises:
 a fourth inverter, having an input end coupled to an output end of the second inverter;
 a NOR gate, having a first input end coupled to an output end of the fourth inverter, and a second input end coupled to an output end of the first inverter;
 a fifth inverter, having an input end coupled to an output end of the NOR gate; and
 a NAND gate, having a first input end coupled to an output end of the third inverter, and a second input end coupled to an output end of the fifth inverter;
 wherein the fourth inverter is configured to output a first bit of the at least two bits outputted from the decoder, and the NAND gate is configured to output a second bit of the at least two bits outputted from the decoder.

* * * * *